(12) United States Patent
Shi

(10) Patent No.: US 12,095,457 B2
(45) Date of Patent: Sep. 17, 2024

(54) RESET SIGNAL TRANSMISSION CIRCUITS, CHIPS, AND ELECTRONIC DEVICES

(71) Applicant: Hefei Whale Micro-Electronics Co., Ltd., Anhui (CN)

(72) Inventor: Ming Shi, Anhui (CN)

(73) Assignee: Hefei Whale Micro-Electronics Co., Ltd., Anhui (CN)

( * ) Notice: Subject to any disclaimer, the term of this patent is extended or adjusted under 35 U.S.C. 154(b) by 0 days.

(21) Appl. No.: 18/588,840

(22) Filed: Feb. 27, 2024

(65) Prior Publication Data

US 2024/0204780 A1 Jun. 20, 2024

Related U.S. Application Data

(63) Continuation of application No. PCT/CN2022/114518, filed on Aug. 24, 2022.

(30) Foreign Application Priority Data

Nov. 30, 2021 (CN) .......................... 202111460820.5

(51) Int. Cl.
*H03K 19/0185* (2006.01)
*H03K 3/012* (2006.01)
*H03K 3/356* (2006.01)

(52) U.S. Cl.
CPC ..... *H03K 19/018521* (2013.01); *H03K 3/012* (2013.01); *H03K 3/356113* (2013.01)

(58) Field of Classification Search
CPC ............................................. H03K 19/018521
USPC ........................................................ 327/333
See application file for complete search history.

(56) References Cited

U.S. PATENT DOCUMENTS

2014/0340136 A1* 11/2014 Teplechuk ....... H03K 3/356182
327/333

FOREIGN PATENT DOCUMENTS

| CN | 103368557 A | 10/2013 |
|----|-------------|---------|
| CN | 103412509 A | 11/2013 |
| CN | 103534949 A | 1/2014 |
| CN | 107704418 A | 2/2018 |
| CN | 108762359 A | 11/2018 |

(Continued)

OTHER PUBLICATIONS

International Search Report and English Translation for International Appllication No. PCT/CN2022/114518 dated Nov. 1, 2022.

*Primary Examiner* — Tomi Skibinski
(74) *Attorney, Agent, or Firm* — Young Basile Hanlon & MacFarlane, P.C.

(57) ABSTRACT

Provided are a reset signal transmission circuit, a chip and an electronic device. The reset signal transmission circuit comprises a level shifting circuit and a first switching circuit, wherein the level shifting circuit is configured to transmit a reset signal from a first voltage domain to a second voltage domain, and the power supply voltage of the first voltage domain is lower than the power supply voltage of the second voltage domain. The first terminal of the first switching circuit is connected to the power supply signal input terminal of the level shifting circuit, and the second terminal of the first switching circuit is connected to the reset signal output terminal of the level shifting circuit. The first switching circuit is configured to control the disconnection of a quiescent current path in the level shifting circuit.

20 Claims, 4 Drawing Sheets

(56) References Cited

FOREIGN PATENT DOCUMENTS

| CN | 108933591 A | 12/2018 |
|---|---|---|
| CN | 114172507 A | 3/2022 |

* cited by examiner

RESET SIGNAL TRANSMISSION CIRCUITS, CHIPS, AND ELECTRONIC DEVICES

CROSS-REFERENCE TO RELATED APPLICATION(S)

The present disclosure is a continuation of International Application No. PCT/CN2022/114518 filed on Aug. 24, 2022, which claims priority to Chinese patent application No. 202111460820.5, filed on Nov. 30, 2021, the entire contents of both of which are hereby incorporated by reference.

TECHNICAL FIELD

The present disclosure relates to the technical field of circuits, and in particular to a reset signal transmission circuit, a chip and an electronic device.

BACKGROUND

For wearable and handheld electronic products, low power consumption is one of the directions to optimize product performance. In many low-power products, quiescent current determines the standby power consumption of the whole system. Since various modules of the entire system may operate in different voltage domains, level shifting circuits are required to transfer reset signals across multiple voltage domains when activating the system from standby mode by a reset signal. In related technologies, level shifting circuits often have quiescent currents, which can lead to a significant increase in the standby power consumption of the entire system.

SUMMARY

The present disclosure is intended to address, at least in part, one of the technical problems in the related art.

In a first aspect, the implementations of the present disclosure provide a reset signal transmission circuit, including: a level shifting circuit and a first switching circuit, where the level shifting circuit is configured to transmit a reset signal from a first voltage domain to a second voltage domain, the supply voltage of the first voltage domain being lower than the supply voltage of the second voltage domain; a first terminal of the first switching circuit is connected to a power supply signal input terminal of the level shifting circuit, and a second terminal of the first switching circuit is connected to a reset signal output terminal of the level shifting circuit; and the first switching circuit is configured to control the disconnection of a quiescent current path in the level shifting circuit.

In some implementations, the first switching circuit includes: a first PMOS field effect transistor, where a source terminal of the first PMOS field effect transistor is connected to a power supply of the second voltage domain, a gate terminal of the first PMOS field effect transistor is connected to the reset signal output terminal of the level shifting circuit, and a drain terminal of the first PMOS field effect transistor is connected to the quiescent current path in the level shifting circuit.

In some implementations, the level shifting circuit includes: a first inverting sub-circuit and a second inverting sub-circuit, where a reset signal input terminal of the first inverting sub-circuit is connected to a reset signal input terminal of the level shifting circuit, a reset signal output terminal of the first inverting sub-circuit is connected to a reset signal input terminal of the second inverting sub-circuit, and a signal output terminal of the second inverting sub-circuit is connected to the reset signal output terminal of the level shifting circuit.

In some implementations, the first inverting sub-circuit includes: a first NMOS field effect transistor and a first resistor, where a gate terminal of the first NMOS field effect transistor is connected to the reset signal input terminal of the first inverting sub-circuit, a source terminal of the first NMOS field effect transistor is grounded, and a drain terminal of the first NMOS field effect transistor is connected to a first terminal of the first resistor; and where the first terminal of the first resistor is connected to a reset signal output terminal of the first inverting sub-circuit, and a second terminal of the first resistor is connected to the first terminal of the first switching circuit.

In some implementations, the second inverting sub-circuit includes: a second PMOS field effect transistor and a second NMOS field effect transistor, where a source terminal of the second PMOS field effect transistor is connected to the power supply of the second voltage domain, a gate terminal of the second PMOS field effect transistor is connected to a gate terminal of the second NMOS field effect transistor, a drain terminal of the second PMOS field effect transistor is connected to a drain terminal of the second NMOS field effect transistor, and where a source terminal of the second NMOS field effect transistor is grounded, a gate terminal of the second NMOS field effect transistor is connected to a reset signal input terminal of the second inverting sub-circuit, and the drain terminal of the second NMOS field effect transistor is connected to a reset signal output terminal of the second inverting sub-circuit.

In some implementations, the circuit further includes a control circuit, where a reset signal input terminal of the control circuit is connected to a reset signal output terminal of the level shifting circuit, and a reset signal output terminal of the control circuit is connected to the second terminal of the first switching circuit.

In some implementations, the control circuit includes: a third inverting sub-circuit and a fourth inverting sub-circuit; where a reset signal input terminal of the third inverting sub-circuit is connected to the reset signal input terminal of the control circuit, a reset signal output terminal of the third inverting sub-circuit is connected to a reset signal input terminal of the fourth inverting sub-circuit, and a reset signal output terminal of the fourth inverting sub-circuit is connected to the reset signal output terminal of the control circuit.

In some implementations, the third inverting sub-circuit includes: a third PMOS field effect transistor and a third NMOS field effect transistor; where a source terminal of the third PMOS field effect transistor is connected to the power supply of the second voltage domain, a gate terminal of the third PMOS field effect transistor is connected to a gate terminal of the third NMOS field effect transistor, and a drain terminal of the third PMOS field effect transistor is connected to a drain terminal of the third NMOS field effect transistor, and where a source terminal of the third NMOS field effect transistor is connected to a control signal input terminal of the third inverting sub-circuit, a gate terminal of the third NMOS field effect transistor is connected to the reset signal input terminal of the third inverting sub-circuit, and a drain terminal of the third NMOS field effect transistor is connected to the reset signal output terminal of the third inverting sub-circuit.

In some implementations, the fourth inverting sub-circuit includes: a fourth PMOS field effect transistor and a fourth NMOS field effect transistor; where the source terminal of the fourth PMOS field effect transistor is connected to the power supply of the second voltage domain, the gate terminal of the fourth PMOS field effect transistor is connected to the gate terminal of the fourth NMOS field effect transistor, the drain terminal of the fourth PMOS field effect transistor is connected to the drain terminal of the fourth NMOS field effect transistor, the source terminal of the fourth NMOS field effect transistor is grounded, and the gate terminal of the fourth NMOS field effect transistor is connected to the reset signal input terminal of the fourth inverting sub-circuit.

In some implementations, the circuit further includes: an inverting circuit; where a reset signal input terminal of the inverting circuit is connected to a reset signal input terminal of the level shifting circuit, and a reset signal output terminal of the inverting circuit is connected to a control signal input terminal of the control circuit.

In some implementations, the inverting circuit includes: a fifth PMOS field effect transistor and a fifth NMOS field effect transistor; where a source terminal of the fifth PMOS field effect transistor is connected to a power supply of the first voltage domain, a gate terminal of the fifth PMOS field effect transistor is connected to a gate terminal of the fifth NMOS field effect transistor, and a drain terminal of the fifth PMOS field effect transistor is connected to a drain terminal of the fifth NMOS field effect transistor; and the source terminal of the fifth NMOS field effect transistor is grounded, the gate terminal of the fifth NMOS field effect transistor is connected to a reset signal input terminal of the inverting circuit, and the drain terminal of the fifth NMOS field effect transistor is connected to a reset signal output terminal of the inverting circuit.

In some implementations, the circuit further includes: an output buffer circuit; where a reset signal input terminal of the output buffer circuit is connected to the reset signal output terminal of the control circuit.

In some implementations, the output buffer circuit includes: a fifth inverting sub-circuit and a sixth inverting sub-circuit; where a reset signal input terminal of the fifth inverting sub-circuit is connected to the reset signal input terminal of the output buffer circuit, a reset signal output terminal of the fifth inverting sub-circuit is connected to a reset signal input terminal of the sixth inverting sub-circuit, and a reset signal output terminal of the sixth inverting sub-circuit is connected to a reset signal output terminal of the output buffer circuit.

In some implementations, the circuit further includes: a second switching circuit and a delay circuit; where a first terminal of the second switching circuit is connected to an output terminal of the delay circuit, a second terminal of the second switching circuit is connected to a control signal input terminal of the level shifting circuit, and the delay circuit is powered by a power supply of the second voltage domain, and where the delay circuit is configured to delay the conduction of the second switching circuit during a power-up process of the power supply of the second voltage domain.

In some implementations, the delay circuit is powered by the power supply of the second voltage domain and is configured to control the delayed conduction of the second switching circuit during the power-up of the power supply of the second voltage domain.

In some implementations, the second switching circuit includes: a sixth PMOS field effect transistor; where a source terminal of the sixth PMOS field effect transistor is connected to the power supply of the second voltage domain, a drain terminal of the sixth PMOS field effect transistor is connected to a control signal input terminal of the level switching circuit, and a gate terminal of the sixth PMOS field effect transistor is connected to the output terminal of the delay circuit.

In some implementations, the delay circuit includes: a first delay sub-circuit, a second delay sub-circuit, and a third delay sub-circuit; where an output terminal of the first delay sub-circuit is connected to an output terminal of the delay circuit, an input terminal of the first delay sub-circuit is connected to an output terminal of the second delay sub-circuit, and an input terminal of the second delay sub-circuit is connected to an output terminal of the third delay sub-circuit.

In some implementations, the first delay sub-circuit includes: a seventh PMOS field effect transistor and a first capacitor; where a source terminal of the seventh PMOS field effect transistor is connected to the power supply of the second voltage domain, a drain terminal of the seventh PMOS field effect transistor is connected to a first terminal of the first capacitor, and a gate terminal of the seventh PMOS field effect transistor is connected to the input terminal of the first delay sub-circuit, and where the first terminal of the first capacitor is connected to an output terminal of the first delay sub-circuit, and a second terminal of the first capacitor is grounded.

In some implementations, the second delay sub-circuit includes: an eighth PMOS field-effect transistor and a sixth NMOS field-effect transistor. The source of the eighth PMOS field-effect transistor is connected to the power supply of the second voltage domain, the drain of the eighth PMOS field-effect transistor is connected to the drain of the sixth NMOS field-effect transistor, and the gate of the eighth PMOS field-effect transistor is connected to the gate of the sixth NMOS field-effect transistor. The source of the sixth NMOS field-effect transistor is grounded, the gate of the sixth NMOS field-effect transistor is connected to the input terminal of the second delay sub-circuit, and the drain of the sixth NMOS field-effect transistor is connected to the output terminal of the second delay sub-circuit.

In some implementations, the third delay sub-circuit includes: a second resistor and a seventh NMOS field-effect transistor. The first terminal of the second resistor is connected to the gate of the seventh NMOS field-effect transistor, and the second terminal of the second resistor is connected to the power supply of the second voltage domain. Both the source and drain of the seventh NMOS field-effect transistor are grounded, and the gate of the seventh NMOS field-effect transistor is connected to the output terminal of the third delay sub-circuit.

In a second aspect, the implementations of the present disclosure provide a chip, including the reset signal transmission circuit of the first aspect.

In a third aspect, the implementations of the present disclosure provide an electronic device, including a chip as described in the second aspect of the present disclosure or a reset signal transmission circuit as described in the first aspect of the present disclosure.

The reset signal circuit provided by the present disclosure first achieves the transmission of the reset signal between different voltage domains through the level shifting circuit, and after the transmission of the reset signal is completed, the standby power consumption of the system is effectively reduced by disconnecting the static circuit path of the level shifting circuit through the first switching circuit.

Additional aspects and advantages of the present disclosure will be partially provided in the following description, and partially become apparent from the following description, or can be understood through practice of the present disclosure.

BRIEF DESCRIPTION OF THE DRAWINGS

The foregoing and/or additional aspects and advantages of the present disclosure will become apparent and readily understood from the following description of implementations in conjunction with the accompanying drawings.

DETAILED DESCRIPTION

Implementations of the present disclosure are described in detail below, and examples of the implementations are shown in the accompanying drawings, where the same or similar reference numbers throughout represent the same or similar elements or elements having the same or similar functions. The implementations described below with reference to the accompanying drawings are examples and are intended to explain the present disclosure, and are not to be construed as limiting the present disclosure.

Figure 1:
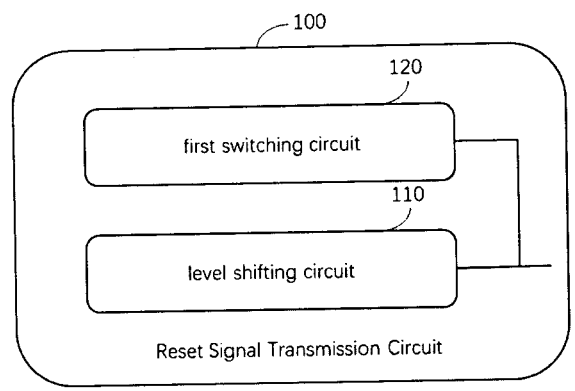
FIG. 1 is a schematic diagram of an example reset signal transmission circuit provided according to some implementations of the present disclosure.

FIG. 1 illustrates a schematic diagram of an example reset signal transmission circuit in some implementations of the present disclosure. As shown in FIG. 1, the reset signal transmission circuit 100 may include a level shifting circuit 110 and a first switching circuit 120.

The level shifting circuit 110 is powered by a power supply in the second voltage domain. The level shifting circuit 110 is configured to receive a reset signal in the first voltage domain and transmit the reset signal from the first voltage domain to the second voltage domain.

It should be noted that, the power supply voltage in the first voltage domain is lower than the power supply voltage in the second voltage domain. The level shifting circuit 110 may change the voltage range of the reset signal during transmission of the reset signal from the first voltage domain to the second voltage domain.

For example, the power supply voltage LV of the first voltage domain is 3.3V, and the power supply voltage HV in the second voltage domain is 5V. In the case where the reset signal in the first voltage domain is shifted from a low level of 0V to a high level of 3.3V, the reset signal in the second voltage domain may be shifted from the low level of 0 V to a high level of 5V after passing through the level shifting circuit 110.

Similarly, in the case where the reset signal in the first voltage domain is shifted from a high level of 3.3V to a low level of 0V, after passing through the level shifting circuit 110, the reset signal in the second voltage domain may be shifted from the high level of 5V to the low level of 0V.

It is to be understood that, a quiescent current inside the circuit may be generated in the level shifting circuit 110 during transmission of the reset signal between the first voltage domain and the second voltage domain. In the implementations of the present disclosure, the first switching circuit 120 is configured to eliminate the quiescent current.

Specifically, a first end of the first switching circuit 120 is connected to a power signal input end of the level shifting circuit 110, a second end of the first switching circuit 120 is connected to a reset signal output end of the level shifting circuit 110. The first switching circuit 120 is configured to control a quiescent current path in the level shifting circuit 110 to be turned off.

For example, if the reset signal in the first voltage domain is shifted from a low level of 0V to a high level of 3.3V, the level shifting circuit 110 forms a quiescent current path in the process of transmitting the reset signal. After the reset signal outputted by the level shifting circuit 110 is shifted from the low level of 0V to the high level of 5V, the first switching circuit 120 may utilize the reset signal outputted by the level shifting circuit 110 to control the disconnection between the level shifting circuit 110 and the power supply, thereby causing the quiescent current path in the level shifting circuit 110 to be disconnected.

The reset signal transmission circuit provided in the implementations of the present disclosure first realizes the transmission of the reset signal between different voltage domains through the level shifting circuit, and after the transmission of the reset signal is completed, the static circuit path of the level shifting circuit is disconnected through the first switching circuit, thereby effectively reducing the standby power consumption of the system.

Figure 2:
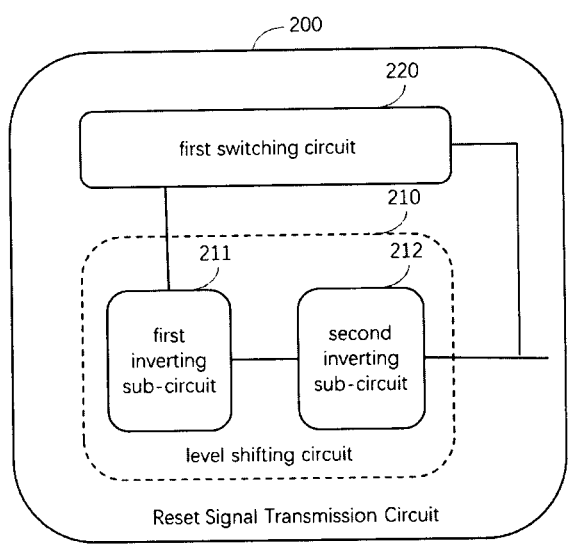
FIG. 2 is a schematic diagram of another example reset signal transmission circuit provided according to some other implementations of the present disclosure.

FIG. 2 illustrates a schematic diagram of another example reset signal transmission circuit in some other implementations of the present disclosure. As shown in FIG. 2, the reset signal transmission circuit 200 may include a level shifting circuit 210 and a first switching circuit 220. the level shifting circuit 210 includes a first inverting sub-circuit 211 and a second inverting sub-circuit 212.

The reset signal input end of the first inverting sub-circuit 211 is connected to the reset signal input end of the level shifting circuit 210, the reset signal output end of the first inverting sub-circuit 211 is connected to the reset signal input end of the second inverting sub-circuit 212, and the signal output end of the second inverting sub-circuit 212 is connected to the reset signal output end of the level shifting circuit 210.

In some implementations, the first inverting sub-circuit 211 can be powered by a power supply in the second voltage domain, and the first inverting sub-circuit 211 can be configured to receive the reset signal in the first voltage domain and to invert the reset signal.

In an example, the power supply voltage LV in the first voltage domain is 3.3 V, and the power supply voltage HV in the second voltage domain is 5 V. If the reset signal in the first voltage domain is a high level of 3.3 V, it can be converted to a low level of 0 V through the first inverting sub-circuit 211. If the reset signal in the first voltage domain is a low level of 0 V, it can be converted through the first inverting sub-circuit 211 to a high level of 5 V.

In some implementations, the second inverting sub-circuit 212 is powered by the power supply in the second voltage domain, and the second inverting sub-circuit 212 is configured to invert the reset signal output from the first inverting sub-circuit 211.

For example, the reset signal outputted by the first inverting sub-circuit 211 is a low level of 0 V, which can be converted to a high level of 5 V by the second inverting sub-circuit 212. Alternatively, the reset signal outputted by the first inverting sub-circuit 211 is a high level of 5 V, which can be converted to a low level of 0 V by the second inverting sub-circuit 212.

Therefore, the reset signal in the first voltage domain, after passing through the first inverting sub-circuit 211 and the second inverting sub-circuit 212, can be converted to within a voltage range corresponding to the second voltage domain without changing the level state.

For example, the reset signal in the first voltage domain is a at high level of 3.3V, and it can be converted to be a high level of 5V through the first inverting sub-circuit 211 and the second inverting sub-circuit 212.

It should be noted that, during transmission of the reset signal through the first inverting sub-circuit 211 between the first voltage domain and the second voltage domain, a quiescent current may be generated in the circuit. In some implementations of the present disclosure, the first end of the first switching circuit 220 is connected to the power signal input end of the first inverting sub-circuit 211, and the second end of the first switching circuit 220 is connected to the reset signal output end of the second inverting sub-circuit 212. The first switching circuit 220 is configured to control the shutting down of the quiescent current path in the first inverting sub-circuit 211.

Figure 3:
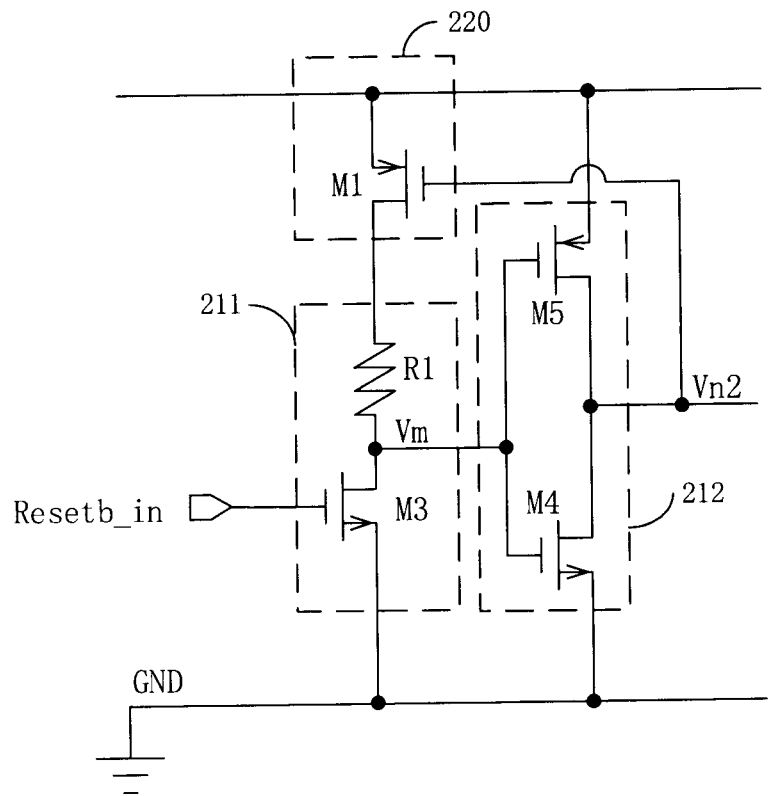
FIG. 3 is a schematic diagram of another example reset signal transmission circuit provided according to some other implementations of the present disclosure.

In some (further or other) implementations of the present disclosure, as shown in FIG. 3, the first switching circuit 220 may include a first PMOS field effect transistor M1.

The source terminal of the first PMOS field effect transistor M1 is connected to the power supply HV in the second voltage domain, the gate terminal of the first PMOS field effect transistor M1 is connected to the reset signal output end of the level shifting circuit 210, and the drain terminal of the first PMOS field effect transistor M1 is connected to the quiescent current path in the level shifting circuit 210.

In some implementations of the present disclosure, as shown in FIG. 3, the first inverting sub-circuit 211 may include a first NMOS field effect transistor M3 and a first resistor R1.

The gate terminal of the first NMOS field effect transistor M3 is connected to a reset signal input end of the first inverting sub-circuit 211, the source terminal of the first NMOS field effect transistor M3 is grounded, and the drain terminal of the first NMOS field effect transistor M3 is connected to a first end of the first resistor R1.

The first end of the first resistor R1 is connected to the reset signal output end of the first inverting sub-circuit 211, and the second end of the first resistor R1 is connected to the first end of the first switching circuit 220.

In some implementations of the present disclosure, as shown in FIG. 3, the second inverting sub-circuit 212 may include a second PMOS field effect transistor M5 and a second NMOS field effect transistor M4.

The source terminal of the second PMOS field effect transistor M5 is connected to the power supply HV in the second voltage domain, the gate terminal of the second PMOS field effect transistor M5 is connected to the gate terminal of the second NMOS field effect transistor M4, and the drain terminal of the second PMOS field effect transistor M5 is connected to the drain terminal of the second NMOS field effect transistor M4.

The source terminal of the second NMOS field effect transistor M4 is grounded, the gate terminal of the second NMOS field effect transistor M4 is connected to a reset signal input terminal of the second inverting sub-circuit 212, and the drain terminal of the second NMOS field effect transistor M4 is connected to a reset signal output terminal of the second inverting sub-circuit 212.

In some implementations of the present disclosure, in the case where the reset signal Resetb_in is shifted from the low level to the high level, the first NMOS field effect transistor M3 turns on, and at this time, the first PMOS field effect transistor M1 is in an on state, and thus the first NMOS field effect transistor M3 pulls down the signal Vm output from the first inverting sub-circuit 211 to a low level. After passing through the second inverting sub-circuit 212, the output signal Vn2 is a high level, which in turn causes the first PMOS field effect transistor M1 to be turned off, and the quiescent current path formed by the first PMOS field effect transistor M1, the first resistor R1, and the first NMOS field effect transistor M3 is cut off.

Figure 4:
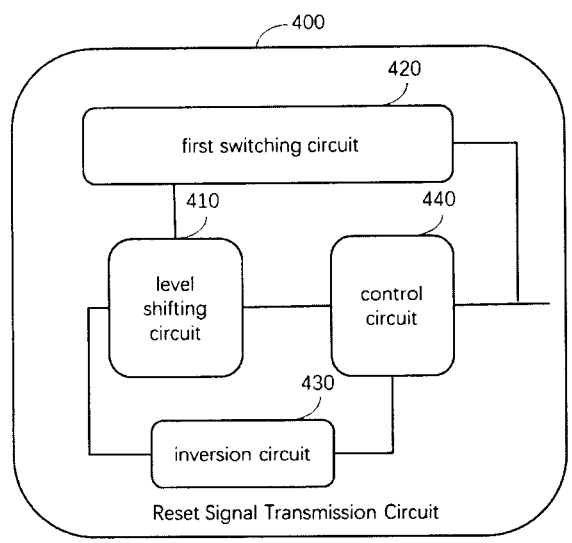
FIG. 4 is a schematic diagram of another example reset signal transmission circuit provided according to some other implementations of the present disclosure.

FIG. 4 illustrates another example schematic diagram of the reset signal transmission circuit in some other implementations of the present disclosure. The implementations described here can be different from the implementations described in connection with the other figures. As shown in FIG. 4, the reset signal transmission circuit 400 may include a level shifting circuit 410, a first switching circuit 420, an inverting circuit 430, and a control circuit 440.

The specific details such as structures and functions of the level shifting circuit 410 and the first switching circuit 420 may refer to the detailed descriptions of other implementations of the present disclosure and will not be repeated herein.

In some implementations, after the reset signal in the first voltage domain is shifted from a low level to a high level and transmitted to the second voltage domain through the level shifting circuit, the static circuit path of the level shifting circuit is cut off through the first switching circuit, which may lead to the reset signal in the second voltage domain becoming uncertain in the case where the reset signal in the first voltage domain is shifted from a high level to a low level.

Therefore, in order to ensure that the level state of the reset signal in the second voltage domain remains consistent with that of the reset signal in the first voltage domain, in some implementations, the reset signal transmission circuit further includes the inverting circuit 430 and the control circuit 440.

The reset signal input terminal of the inverting circuit 430 is connected to the reset signal input terminal of the level shifting circuit 410, and the reset signal output terminal of the inverting circuit 430 is connected to the control signal input terminal of the control circuit 440.

The reset signal input end of the control circuit 440 is connected (via the inversion circuit 430) to the reset signal output end of the level shifting circuit 410, and the reset signal output end of the control circuit 440 is connected to the second end of the first switching circuit 420.

The inverting circuit 430 is supplied with power by the power supply LV in the first voltage domain, and in the case that the reset signal in the first voltage domain is shifted from a high level to a low level, the reset signal outputted by the inverting circuit 430 is shifted from a low level to a high level. Further, the reset signal outputted by the inverting circuit 430 may be used as a control signal to ensure that the reset signal outputted by the control circuit 440 is shifted from the high level to the low level.

Figure 5:
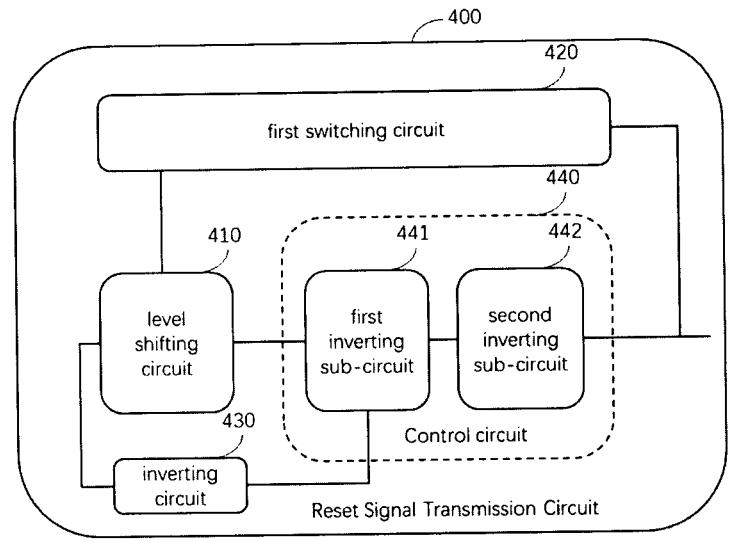
FIG. 5 is a schematic diagram of another example reset signal transmission circuit provided according to some other implementations of the present disclosure.

In some implementations of the present disclosure, as shown in FIG. 5, the control circuit 440 may include a third inverting sub-circuit 441 and a fourth inverting sub-circuit 442. The implementations described here can be different from the implementations described in connection with the other figures.

The reset signal input end of the third inverting sub-circuit 441 is connected to the reset signal input end of the control circuit 440, the reset signal output end of the third inverting sub-circuit 441 is connected to the reset signal input end of the fourth inverting sub-circuit 442, and the reset signal output end of the fourth inverting sub-circuit 442 is connected to the reset signal output end of the control circuit 440.

In some implementations, the inverting circuit 430 is supplied with power through the power supply LV in the first voltage domain, and in the case where the reset signal in the first voltage domain is shifted from a high level to a low level, the reset signal outputted by the inverting circuit 430 is shifted from a low level to a high level. In this case, regardless of the level state of the reset signal output by the level shifting circuit 410, the signal a high level output by the inverting circuit 430 can control the third inverting sub-circuit 441 to output a signal a high level, which in turn causes the fourth inverting sub-circuit 442 to output a signal a low level, thereby ensuring that the control circuit 440 outputs a signal a low level.

Figure 6:
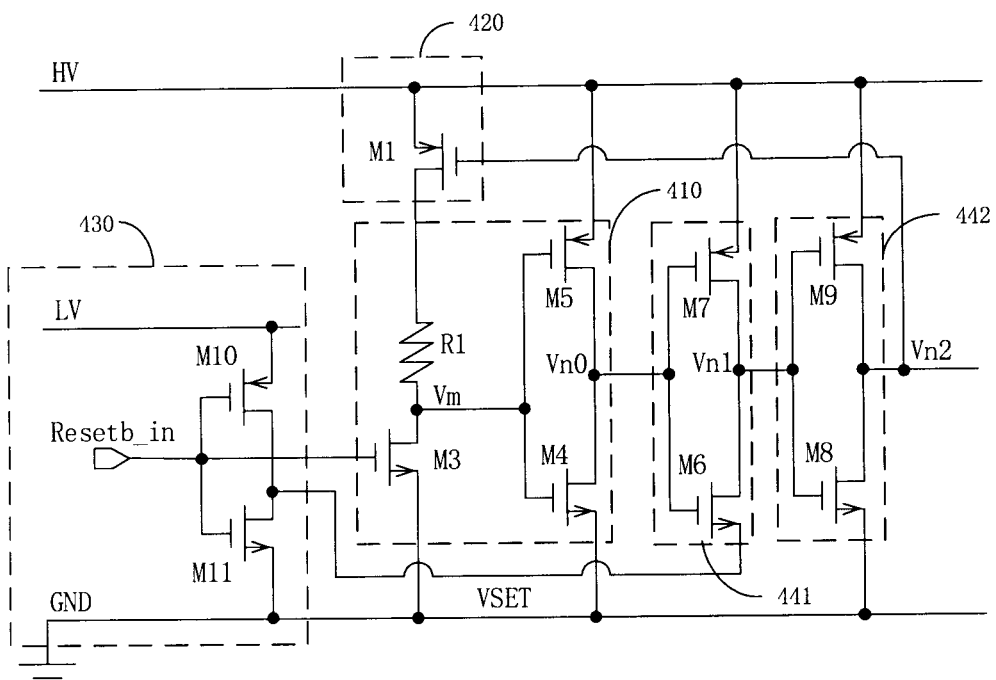
FIG. 6 is a schematic diagram of another example reset signal transmission circuit provided according to some other implementations of the present disclosure.

In some implementations of the present disclosure, as shown in FIG. 6, the third inverting sub-circuit 441 may include a third PMOS field effect transistor M7 and a third NMOS field effect transistor M6. The implementations described here can be different from the implementations described in connection with the other figures.

The source terminal of the third PMOS field effect transistor M7 is connected to the power supply in the second voltage domain, the gate terminal of the third PMOS field effect transistor M7 is connected to the gate terminal of the third NMOS field effect transistor M6, and the drain terminal of the third PMOS field effect transistor M7 is connected to the drain terminal of the third NMOS field effect transistor M6.

The source terminal of the third NMOS field effect transistor M6 is connected to the control signal input terminal of the third inverting sub-circuit 441, the gate terminal of the third NMOS field effect transistor M6 is connected to the reset signal input terminal of the third inverting sub-circuit 441, and the drain terminal of the third NMOS field effect transistor M6 is connected to the reset signal output terminal of the third inverting sub-circuit 441.

In some implementations of the present disclosure, as shown in FIG. 6, the fourth inverting sub-circuit 442 may include a fourth PMOS field effect transistor M9 and a fourth NMOS field effect transistor M8.

The source terminal of the fourth PMOS field effect transistor M9 is connected to the power supply in the second voltage domain, the gate terminal of the fourth PMOS field effect transistor M9 is connected to the gate terminal of the fourth NMOS field effect transistor M8, and the drain terminal of the fourth PMOS field effect transistor M9 is connected to the drain terminal of the fourth NMOS field effect transistor M8.

The source terminal of the fourth NMOS field effect transistor M8 is grounded, the gate terminal of the fourth NMOS field effect transistor M8 is connected to the reset signal input terminal of the fourth inverted sub-circuit 442, and the drain terminal of the fourth NMOS field effect transistor M8 is connected to the reset signal output terminal of the fourth inverted sub-circuit 442.

In some implementations of the present disclosure, as shown in FIG. 6, the inverting circuit 430 may include a fifth PMOS field effect transistor M10 and a fifth NMOS field effect transistor M11.

The source terminal of the fifth PMOS field effect transistor M10 is connected to the power supply in the first voltage domain, the gate terminal of the fifth PMOS field effect transistor M10 is connected to the gate terminal of the fifth NMOS field effect transistor M11, and the drain terminal of the fifth PMOS field effect transistor M10 is connected to the drain terminal of the fifth NMOS field effect transistor M11.

The source terminal of the fifth NMOS field effect transistor M11 is grounded, the gate terminal of the fifth NMOS field effect transistor M11 is connected to the reset signal input terminal of the inverting circuit, and the drain terminal of the fifth NMOS field effect transistor M11 is connected to the reset signal output terminal of the inverting circuit.

In some implementations of the present disclosure, in the case where the reset signal Resetb_in of the first voltage domain is shifted from a low level to a high level, the first NMOS field effect transistor M3 turns on. In this case, the first PMOS field effect transistor M1 is in an on state, and thus the first NMOS field effect transistor M3 pulls down the level of the output Vm of the first inverting circuit to a low level. Consequently, the output Vn0 of the second inverting circuit is a high level, the output Vn1 of the third inverting sub-circuit is a low level, and the output Vn2 of the fourth inverting sub-circuit is a high level, thereby causing the first PMOS field effect transistor M1 to be off, and the quiescent current path formed by the first PMOS field effect transistor M1, the first resistor R1, and the first NMOS field effect transistor M3 to be cut off.

In the case where the reset signal Resetb_in is shifted from a high level to a low level, the first NMOS field effect transistor M3 is off, and the inverting circuit outputs a level VSET that is shifted from a low level to the power supply voltage LV in the first voltage domain. In this case, regardless of the input state of the third inverting sub-circuit, the output level Vn1 is always in the range between the power supply voltage LV in the first voltage domain and the power supply voltage HV in the second voltage domain, i.e., between a low level and a high level. The flip voltage of the fourth inverting sub-circuit is less than the power supply voltage LV in the first voltage domain, and after passing through the fourth inverting sub-circuit, the output level Vn2 is a low level. The first PMOS FET M1 is turned on, and the level Vm output by the first inverting sub-circuit transitions from a low level to a high level. Therefore, the level Vn0 output by the second inverting sub-circuit is low, the level Vn1 output by the third inverting sub-circuit is high, and the output Vn2 output by the fourth inverting sub-circuit is low. Meanwhile, since the first PMOS field-effect transistor M1 is turned on and the first NMOS field-effect transistor M3 is turned off, the first PMOS field effect transistor M1, the first resistor R1, and the first NMOS field effect transistor M3 cannot form a conducted quiescent current path.

Figure 7:
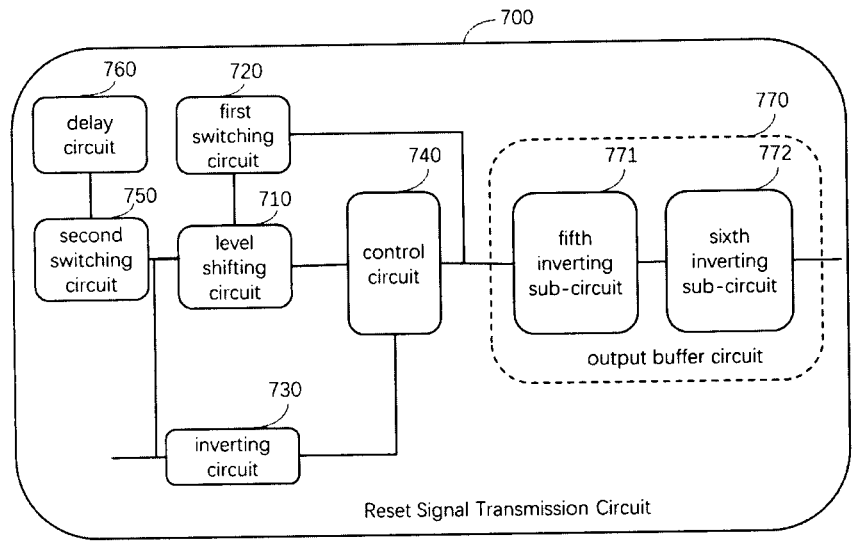
FIG. 7 is a schematic diagram of another example reset signal transmission circuit provided according to some other implementations of the present disclosure.

FIG. 7 illustrates a schematic diagram of another example reset signal transmission circuit in some other implementations of the present disclosure. The implementations described here can be different from the implementations described in connection with the other figures. As shown in FIG. 7, the reset signal transmission circuit 700 may include a level shifting circuit 710, a first switching circuit 720, an inverting circuit 730, a control circuit 740, a second switching circuit 750, a delay circuit 760, and an output buffer circuit 770.

The specific realization of the level shifting circuit 710, the first switching circuit 720, the inverting circuit 730, and the control circuit 740 may be described in detail with reference to other implementations of the present disclosure and will not be repeated herein.

It should be noted that flipping of the voltage level in the circuit during the transmission of the reset signal between different voltage domains is related to the power-on sequence of the power supply in the first voltage domain and the power supply in the second voltage domain. If the power supply in the first voltage domain is turned on later than the power supply in the second voltage domain, or if the power supply in the second voltage domain is active and the power supply in the first voltage domain is inactive, it may cause the circuit to be in an uncertain state, resulting in a failure of the circuit to operate.

Therefore, in order to ensure that the power-on sequence of the power supply in the first voltage domain and the power supply in the second voltage domain does not affect the normal operation of the circuit, the reset signal transmission circuit in some implementations of the present disclosure further includes a second switching circuit 750 and a delay circuit 760.

A first end of the second switching circuit 750 is connected to an output end of the delay circuit 760, and a second end of the second switching circuit 750 is connected to a control signal input end of the level shifting circuit 710.

The delay circuit 760 is powered by the power supply in the second voltage domain, and the delay circuit 760 is configured to control a delayed connection of the second switching circuit 750 in the case where the power supply in the second voltage domain is powered up, so as to cause the level shifting circuit 710 to output a low level in the event that the power supply in the first voltage domain is powered on later than the power supply in the second voltage domain.

In some implementations of the present disclosure, the reset signal transmission circuit 700 further includes an output buffer circuit 770. A reset signal input terminal of the output buffer circuit 770 is connected to the reset signal output terminal of the control circuit 740, and the output buffer circuit 770 is configured to buffer the reset signal output from the control circuit 740 to improve the driving capability of the output signal.

The output buffer circuit 770 may include a fifth inverting sub-circuit 771 and a sixth inverting sub-circuit 772.

The reset signal input terminal of the fifth inverting sub-circuit 771 is connected to the reset signal input terminal of the output buffer circuit 770, the reset signal output terminal of the fifth inverting sub-circuit 771 is connected to the reset signal input terminal of the sixth inverting sub-circuit 776, and the reset signal output terminal of the sixth inverting sub-circuit 776 is connected to the reset signal output terminal of the output buffer circuit 770.

Figure 8:
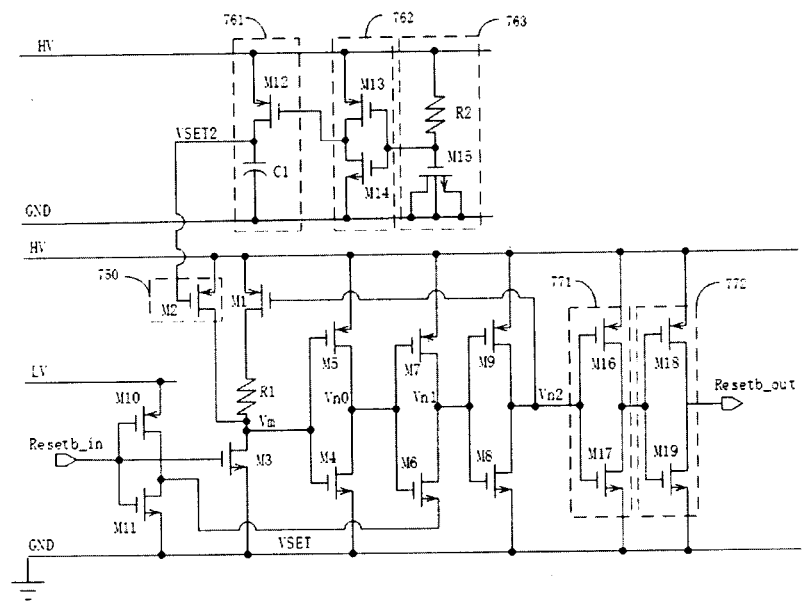
FIG. 8 shows a schematic diagram of yet another example reset signal transmission circuit provided according to some other implementations of the present disclosure.

In some implementations of the present disclosure, as shown in FIG. 8, the second switching circuit 750 may include a sixth PMOS field effect transistor M2.

The source terminal of the sixth PMOS field effect transistor M2 is connected to the power supply in the second voltage domain, the drain terminal of the sixth PMOS field effect transistor M2 is connected to the control signal input of the level shifting circuit 710, and the gate terminal of the sixth PMOS field effect transistor M2 is connected to the output terminal of the delay circuit 760.

In some implementations of the present disclosure, as shown in FIG. 8, the delay circuit 760 may include a first delay sub-circuit 761, a second delay sub-circuit 762, and a third delay sub-circuit 763. The implementations described here can be different from the implementations described in connection with the other figures.

The output end of the first delay sub-circuit 761 is connected to an output end of the delay circuit 760, an input end of the first delay sub-circuit 761 is connected to an output end of the second delay sub-circuit 762, and an input end of the second delay sub-circuit 762 is connected to an output end of the third delay sub-circuit 763.

In some implementations, the first delay sub-circuit 761 may include a seventh PMOS field effect transistor M12 and a first capacitor C1.

The source terminal of the seventh PMOS field effect transistor M12 is connected to the power supply in the second voltage domain, the drain terminal of the seventh PMOS field effect transistor M12 is connected to the first end of the first capacitor C1, and the gate terminal of the seventh PMOS field effect transistor M12 is connected to the input end of the first delay sub-circuit 761; the first end of the first capacitor C1 is connected to the output end of the first delay sub-circuit 761 and the first second end of the capacitor C1 is grounded.

The second delay sub-circuit 762 may include an eighth PMOS field effect transistor M13 and a sixth NMOS field effect transistor M14.

The source terminal of the eighth PMOS field effect transistor M13 is connected to the power supply in the second voltage domain, the drain terminal of the eighth PMOS field effect transistor M13 is connected to the drain terminal of the sixth NMOS field effect transistor M14, and the gate terminal of the eighth PMOS field effect transistor M13 is connected to the gate terminal of the sixth NMOS field effect transistor M14.

The source terminal of the sixth NMOS field effect transistor M14 is grounded, the gate terminal of the sixth NMOS field effect transistor M14 is connected to an input end of the second delay sub-circuit 762, and the drain terminal of the sixth NMOS field effect transistor M14 is connected to an output end of the second delay sub-circuit 762.

The third delay sub-circuit 763 may include a second resistor R2 and a seventh NMOS field effect transistor M15.

A first end of the second resistor R2 is connected to the gate terminal of the seventh NMOS field effect transistor M15, and a second end of the second resistor R2 is connected to the power supply in the second voltage domain.

The source and the drain terminals of the seventh NMOS field effect transistor M15 are grounded, and the gate terminal of the seventh NMOS field effect transistor M15 is connected to the output terminal of the third delay sub-circuit 763.

It should be noted that, the delay circuit 760 may be configured according to actual needs. For example, the delay circuit 760 may be formed with only the first capacitor C1 and the second resistor R2, and the present disclosure does not limit this.

In some implementations of the present disclosure, as shown in FIG. 8, the fifth inverting sub-circuit 771 may include a ninth PMOS field effect transistor M16 and an eighth NMOS field effect transistor M17. The implementations described here can be different from the implementations described in connection with the other figures.

The source terminal of the ninth PMOS field effect transistor M16 is connected to the power supply HV in the second voltage domain, the gate terminal of the ninth PMOS field effect transistor M16 is connected to the gate terminal of the eighth NMOS field effect transistor M17, and the drain terminal of the ninth PMOS field effect transistor M16 is connected to the drain terminal of the eighth NMOS field effect transistor M17. The source terminal of the eighth NMOS field effect transistor M17 is grounded, the gate terminal of the eighth NMOS field effect transistor M17 is connected to the reset signal input terminal of the fifth inverting sub-circuit 771, and the drain terminal of the eighth NMOS field effect transistor M17 is connected to the reset signal output terminal of the fifth inverting sub-circuit 771.

The sixth inverting sub-circuit 772 may include a tenth PMOS field effect transistor M18 and a ninth NMOS field effect transistor M19.

The source terminal of the tenth PMOS field effect transistor M18 is connected to the power supply HV in the second voltage domain, the gate terminal of the tenth PMOS field effect transistor M18 is connected to the gate terminal of the ninth NMOS field effect transistor M19, and the drain terminal of the tenth PMOS field effect transistor M18 is connected to the drain terminal of the ninth NMOS field effect transistor M19. The source terminal of the ninth NMOS field effect transistor M19 is grounded, the gate terminal of the ninth NMOS field effect transistor M19 is connected to the reset signal input terminal of the sixth inverting sub-circuit 772, and the drain terminal of the ninth NMOS field effect transistor M19 is connected to the reset signal output terminal of the sixth inverting sub-circuit 772.

The specific operation of the reset signal transmission circuit in some implementations of the present disclosure is described in detail below.

In the first scenario, the power supply voltage HV in the second voltage domain is powered up first, and then the power supply voltage LV in the first voltage domain is powered up.

During the gradual rise of the power supply voltage HV in the second voltage domain, since there is a certain delay for VSET2 to follow the climb of the power supply voltage HV in the second voltage domain, the sixth PMOS field effect transistor M2 can conduct during the power-up process, so as to pull up the output voltage Vm of the first inverting sub-circuit to a high level. After passing through the second inverting sub-circuit, the third inverting sub-circuit, and the fourth inverting sub-circuit, the output voltage Vn2 is a low level, which in turn causes the first PMOS field effect transistor M1 to begin conducting, the voltage Vm remains a high level, ultimately resulting in the output signal Resetb_out remaining in a low state.

The power supply voltage HV of the second voltage domain is fully powered up, VSET2 climbs to the power supply voltage HV of the second voltage domain, and the sixth PMOS field effect transistor M2 is turned off. Since the first PMOS field effect transistor M1 is conducting at this point, the voltage Vm continues to remain high, and the output signal Resetb_out remains in a low state.

When the power supply voltage LV of the first voltage domain begins to power up, the VSET flips from a low level to the power supply voltage LV of the first voltage domain, and the intermediate voltage Vn1 output by the third inverting sub-circuit remains at a high level, and thus the output signal Resetb_out remains in a low level state.

In the second scenario, the supply voltage LV of the first voltage domain is powered up first, and then the supply voltage HV in the second voltage domain is powered up.

When the power supply voltage LV of the first voltage domain starts to power up, the VSET flips from a low level to the power supply voltage LV of the first voltage domain, and the intermediate voltage Vn1 output by the third inverting sub-circuit remains at a high level, thus keeping the output signal Resetb_out in a low level state.

During the gradual rise of the power supply voltage HV in the second voltage domain, since there is a certain delay in VSET2 following the climb of the supply voltage HV of the second voltage domain, the sixth PMOS field effect transistor M2 may conduct during the power-up process, thus raising the voltage Vm output by the first inverting sub-circuit to a high level. After passing through the second inverting sub-circuit, the third inverting sub-circuit, and the fourth inverting sub-circuit, the output voltage Vn2 is at a low level, which in turn causes the first PMOS field effect transistor M1 to begin conducting. The voltage Vm remains at a high level, ultimately resulting in the output signal Resetb_out remaining in a low state.

After the power supply voltage HV of the second voltage domain is fully powered up, VSET2 rises to the HV voltage of the second voltage domain, and the sixth PMOS field-effect transistor M2 turns off. Since the first PMOS field-effect transistor M1 is conducting at this point, the voltage Vm continues to remain high, and the output signal Resetb_out remains in a low state.

From the above, it can be seen that, during the power-up process of the power supplies in the first and second voltage domains, regardless of the order in which they power up, the circuit can maintain the output signal Resetb_out in a low state.

In the third scenario, the reset signal Resetb_in of the first voltage domain is shifted from a low level to a high level.

When the reset signal Resetb_in of the first voltage domain is shifted from a low level to a high level, the first NMOS field effect transistor M3 conducts. Since the first PMOS field effect transistor M1 is in a conducting state at this moment, the first NMOS field effect transistor M3 pulls down the voltage Vm output from the first inverting sub-circuit to a low level. Subsequently, after the second inverting sub-circuit, the third inverting sub-circuit and the fourth inverting sub-circuit, the output voltage Vn2 is at a high level, which in turn causes the first PMOS field effect transistor M1 to turn off, and the quiescent current path formed by the first PMOS field effect transistor M1, the first resistor R1, and the first NMOS field effect transistor M3 is cut off. Simultaneously, the output signal Resetb_out is shifted from a low level to a high level.

In the fourth scenario, the reset signal Resetb_in of the first voltage domain is shifted from a high level to a low level.

When the reset signal Resetb_in of the first voltage domain is shifted from a high level to a low level, the first NMOS field effect transistor M3 is turned off, and the VSET is shifted from a low level to the power supply voltage LV of the first voltage domain, and in this case, regardless of the input state of the third inverting sub-circuit, the output intermediate voltage Vn1 is always between the power supply voltage LV of the first voltage domain and the power supply voltage HV in the second voltage domain, i.e., between a low level and a high level. The output voltage Vn2 from the fourth inverting sub-circuit is at a low level, the first PMOS FET M1 conducts at this point, and the output Vm of the first inverting sub-circuit is shifted from a low level to a high level, and then, after passing through the second inverting sub-circuit, the third inverting sub-circuit, and the fourth inverting sub-circuit, the output Vn2 is at a low level, causing the output signal Resetb_out to shift from a high level to a low level. Meanwhile, since the first PMOS field effect transistor M1 conducts and the first NMOS field effect transistor M3 is turned off, the first PMOS field effect transistor M1, the first resistor R1, and the first NMOS field effect transistor M3 cannot form a quiescent current path.

In some implementations, a chip can be provided to include the reset signal transmission circuit as described in the implementations of the present disclosure.

In some implementations, an electronic device can be provided to include the reset signal transmission circuit as described in the implementations of the present disclosure, or to include the chip as described in the implementations of the present disclosure.

In the description of the present disclosure, reference terms such as "some implementations," "some implementations," "example," "specific examples," or "some examples" are intended to refer to specific features, structures, materials, or characteristics described in conjunction with the implementations or examples are included in at least one implementation or example of the present disclosure. In the present disclosure, illustrative expressions of the above terms do not necessarily refer to the same implementation or example. Moreover, the specific features, structures, materials, or characteristics described may be combined in any one or more implementations or examples in a suitable manner. Moreover, in cases where they are not mutually contradictory, those skilled in the art may combine and integrate different implementations or examples as well as the features of different implementations or examples described in the specification.

Furthermore, the terms "first" and "second" are used for descriptive purposes only, and should not to be understood as indicating or implying relative importance or implicitly specifying the quantity of technical features indicated. Thus, features defined with "first", "second" may explicitly or implicitly include at least one such feature. In the description of the present disclosure, the term "plurality" means at least two, e.g., two, three, etc., unless otherwise specifically defined.

What is claimed is:

1. A circuit for reset signal transmission, comprising:
   a level shifting circuit and a first switching circuit, wherein the level shifting circuit is configured to transmit a reset signal from a first voltage domain to a second voltage domain, wherein a supply voltage of the first voltage domain is lower than a supply voltage of the second voltage domain;
   a first terminal of the first switching circuit is connected to a power supply signal input terminal of the level shifting circuit, and a second terminal of the first switching circuit is connected to a reset signal output terminal of the level shifting circuit; and
   the first switching circuit is configured to control a disconnection of a quiescent current path in the level shifting circuit.

2. The circuit of claim 1, wherein the first switching circuit is configured to:
   responsive to the reset signal output by the level shifting circuit, cut off a connection between the level shifting circuit and the power supply of the second voltage domain.

3. The circuit of claim 1, wherein the first switching circuit comprises:
   a first PMOS field effect transistor, a source terminal of the first PMOS field effect transistor being connected to a power supply of the second voltage domain, a gate terminal of the first PMOS field effect transistor being connected to the reset signal output terminal of the level shifting circuit, and a drain terminal of the first PMOS field effect transistor being connected to the power supply signal input terminal of the level shifting circuit.

4. The circuit of claim 1, wherein the level shifting circuit comprises:
   a first inverting sub-circuit and a second inverting sub-circuit,
   wherein a reset signal input terminal of the first inverting sub-circuit is connected to a reset signal input terminal of the level shifting circuit, a reset signal output terminal of the first inverting sub-circuit is connected to a reset signal input terminal of the second inverting sub-circuit, and a signal output terminal of the second inverting sub-circuit is connected to the reset signal output terminal of the level shifting circuit.

5. The circuit of claim 4, wherein the first inverting sub-circuit comprises:
   a first NMOS field effect transistor and a first resistor,
   wherein a gate terminal of the first NMOS field effect transistor is connected to the reset signal input terminal of the first inverting sub-circuit, a source terminal of the first NMOS field effect transistor is grounded, and a drain terminal of the first NMOS field effect transistor is connected to a first terminal of the first resistor, and
   the first terminal of the first resistor is connected to a reset signal output terminal of the first inverting sub-circuit, and a second terminal of the first resistor is connected to the first terminal of the first switching circuit.

6. The circuit of claim 4, wherein the second inverting sub-circuit comprises:
   a second PMOS field effect transistor and a second NMOS field effect transistor,
   wherein a source terminal of the second PMOS field effect transistor is connected to the power supply of the second voltage domain, a gate terminal of the second PMOS field effect transistor is connected to a gate terminal of the second NMOS field effect transistor, a drain terminal of the second PMOS field effect transistor is connected to a drain terminal of the second NMOS field effect transistor, and
   a source terminal of the second NMOS field effect transistor is grounded, a gate terminal of the second NMOS field effect transistor is connected to a reset signal input terminal of the second inverting sub-circuit, and the drain terminal of the second NMOS field effect transistor is connected to a reset signal output terminal of the second inverting sub-circuit.

7. The circuit of claim 1, further comprising:
   a control circuit,
   wherein a reset signal input terminal of the control circuit is connected to a reset signal output terminal of the level shifting circuit, and a reset signal output terminal of the control circuit is connected to the second terminal of the first switching circuit.

8. The circuit of claim 7, wherein the control circuit comprises:
   a third inverting sub-circuit and a fourth inverting sub-circuit,
   wherein a reset signal input terminal of the third inverting sub-circuit is connected to the reset signal input terminal of the control circuit, a reset signal output terminal of the third inverting sub-circuit is connected to a reset signal input terminal of the fourth inverting sub-circuit, and a reset signal output terminal of the fourth inverting sub-circuit is connected to the reset signal output terminal of the control circuit.

9. The circuit of claim 8, wherein the third inverting sub-circuit comprises:
a third PMOS field effect transistor and a third NMOS field effect transistor,
wherein a source terminal of the third PMOS field effect transistor is connected to the power supply of the second voltage domain, a gate terminal of the third PMOS field effect transistor is connected to a gate terminal of the third NMOS field effect transistor, and a drain terminal of the third PMOS field effect transistor is connected to a drain terminal of the third NMOS field effect transistor, and
a source terminal of the third NMOS field effect transistor is connected to a control signal input terminal of the third inverting sub-circuit, a gate terminal of the third NMOS field effect transistor is connected to the reset signal input terminal of the third inverting sub-circuit, and a drain terminal of the third NMOS field effect transistor is connected to the reset signal output terminal of the third inverting sub-circuit.

10. The circuit of claim 7, further comprising:
an inverting circuit,
wherein a reset signal input terminal of the inverting circuit is connected to a reset signal input terminal of the level shifting circuit, and a reset signal output terminal of the inverting circuit is connected to a control signal input terminal of the control circuit.

11. The circuit of claim 10, wherein the inverting circuit is powered up by a power supply of the first voltage domain, and the inverting circuit is configured to cause the control circuit to output the reset signal at a low level regardless of the level state of the reset signal output by the level shifting circuit.

12. The circuit of claim 7, further comprising:
an output buffer circuit,
wherein a reset signal input terminal of the output buffer circuit is connected to the reset signal output terminal of the control circuit.

13. The circuit of claim 12, wherein the output buffer circuit comprises:
a fifth inverting sub-circuit and a sixth inverting sub-circuit,
wherein a reset signal input terminal of the fifth inverting sub-circuit is connected to the reset signal input terminal of the output buffer circuit, a reset signal output terminal of the fifth inverting sub-circuit is connected to a reset signal input terminal of the sixth inverting sub-circuit, and a reset signal output terminal of the sixth inverting sub-circuit is connected to a reset signal output terminal of the output buffer circuit.

14. The circuit of claim 1, further comprising:
a second switching circuit and a delay circuit,
wherein a first terminal of the second switching circuit is connected to an output terminal of the delay circuit, a second terminal of the second switching circuit is connected to a control signal input terminal of the level shifting circuit.

15. The circuit of claim 14, wherein the second switching circuit conducts during power-up of the power supply of the second voltage domain, and
the delay circuit is configured to delay the conduction of the second switching circuit during a power-up process of the power supply of the second voltage domain.

16. The circuit of claim 14, wherein the second switching circuit comprises:
a sixth PMOS field effect transistor,
wherein a source terminal of the sixth PMOS field effect transistor is connected to the power supply of the second voltage domain, a drain terminal of the sixth PMOS field effect transistor is connected to a control signal input terminal of the level switching circuit, and a gate terminal of the sixth PMOS field effect transistor is connected to the output terminal of the delay circuit.

17. The circuit of claim 14, wherein the delay circuit comprises:
a first delay sub-circuit, a second delay sub-circuit, and a third delay sub-circuit,
wherein an output terminal of the first delay sub-circuit is connected to an output terminal of the delay circuit, an input terminal of the first delay sub-circuit is connected to an output terminal of the second delay sub-circuit, and an input terminal of the second delay sub-circuit is connected to an output terminal of the third delay sub-circuit.

18. The circuit of claim 17, wherein the first delay sub-circuit comprises:
a seventh PMOS field effect transistor and a first capacitor,
wherein a source terminal of the seventh PMOS field effect transistor is connected to the power supply of the second voltage domain, a drain terminal of the seventh PMOS field effect transistor is connected to a first terminal of the first capacitor, and a gate terminal of the seventh PMOS field effect transistor is connected to the input terminal of the first delay sub-circuit, and
the first terminal of the first capacitor is connected to an output terminal of the first delay sub-circuit, and a second terminal of the first capacitor is grounded.

19. A chip, comprising the circuit of claim 1.

20. An electronic device, comprising the circuit of claim 1.

* * * * *